United States Patent
Hau

(10) Patent No.: US 8,736,378 B1
(45) Date of Patent: May 27, 2014

(54) RECONFIGUREABLE OUTPUT MATCHING NETWORK FOR MULTI BAND RF POWER AMPLIFIER

(71) Applicant: Gary Hau, Westford, MA (US)

(72) Inventor: Gary Hau, Westford, MA (US)

(73) Assignee: Anadigics, Inc., Warren, NJ (US)

( * ) Notice: Subject to any disclaimer, the term of this patent is extended or adjusted under 35 U.S.C. 154(b) by 28 days.

(21) Appl. No.: 13/690,295

(22) Filed: Nov. 30, 2012

Related U.S. Application Data

(60) Provisional application No. 61/567,584, filed on Dec. 6, 2011.

(51) Int. Cl.
*H03F 3/191* (2006.01)
(52) U.S. Cl.
USPC .................. 330/302; 330/147; 330/148
(58) Field of Classification Search
USPC .......................... 330/302, 147, 148
See application file for complete search history.

(56) References Cited

U.S. PATENT DOCUMENTS

| | | | | |
|---|---|---|---|---|
| 4,755,779 | A * | 7/1988 | Gignoux | 333/173 |
| 6,054,902 | A * | 4/2000 | Masato | 330/306 |
| 7,440,729 | B2 * | 10/2008 | Solski et al. | 455/46 |
| 7,696,842 | B2 * | 4/2010 | Uejima et al. | 333/133 |
| 7,764,125 | B2 | 7/2010 | Dawe et al. | |
| 7,876,159 | B2 | 1/2011 | Wang et al. | |
| 2002/0118067 | A1 * | 8/2002 | Hirayama | 330/302 |
| 2008/0088376 | A1 * | 4/2008 | Tateoka et al. | 330/277 |
| 2013/0109434 | A1 * | 5/2013 | Dupuy et al. | 455/552.1 |
| 2013/0207739 | A1 * | 8/2013 | Bakalski | 333/33 |

OTHER PUBLICATIONS

Zhang, C. et al, "A Novel Reconfigurable Power Amplifier Structure for Multi-Band and Multi-Mode Portable Wireless Applications using a Reconfigurable Die and a Switchable Output Matching Network", IEEE MTT-S Int. Microwave Symp. Dig., Jun. 2009, pp. 913-916.

Fukuda, A. et al, "A high power and highly efficient multi-band power amplifier for mobile terminals", IEEE RWS Dig., Jan. 2010, pp. 45-48.

Fukuda, A. et al, "Concurrent Multi-band Power Amplifier Employing Multi-section Impedance Transformer", 2011 IEEE Topical Conference on Power Amplifiers for Wireless and Radio Applications (PAWR), Jan. 2011, pp. 37-40.

\* cited by examiner

*Primary Examiner* — Patricia Nguyen
(74) *Attorney, Agent, or Firm* — William L Botjer

(57) ABSTRACT

An output matching network comprising a plurality of impedance matching circuits. The inputs of each of the plurality of impedance matching circuits are connected to a first input of the output matching network. The outputs of each of the plurality of impedance matching circuits are connected to a plurality of first outputs of the output matching network. One of the plurality of impedance matching circuits is active at a given time. The active impedance matching circuit of the plurality of impedance matching circuits exhibits a first input impendence at a first frequency band. Each inactive impedance matching circuit of the plurality of impedance matching circuits exhibits a second input impedance at the first frequency band. The second input impendence is at least 10 times greater than the first input impendence.

17 Claims, 7 Drawing Sheets

RECONFIGUREABLE OUTPUT MATCHING NETWORK FOR MULTI BAND RF POWER AMPLIFIER

CROSS REFERENCE TO RELATED APPLICATION

This application claims priority from U.S. provisional application No. 61/567,584, titled "Reconfigurable output matching network for multi band RF power amplifier", filed on Dec. 6, 2011, the disclosure of which is hereby incorporated by reference.

TECHNICAL FIELD

The present disclosure relates to a multi band RF power amplifier. More particularly, the present disclosure relates to a reconfigurable output matching network for the multi band RF power amplifier.

BACKGROUND

Currently available mobile handsets are compatible with networks such as GSM, 3G, and 4G networks. Each of these networks operates at a different frequency band. Traditionally, multiple separate power amplifiers are used to amplify signals of multiple frequency bands. For instance, two power amplifiers have to be used in a mobile handset operable at two frequency bands. Each of the two power amplifiers are then optimized for each of the two frequency bands. This is done to satisfy a maximum linear output power requirement that is usually different between the frequency bands, depending on the loss between the power amplifiers and an antenna. It has also been observed that the optimum load impedance required for each of the two power amplifiers may vary considerably. Although such an approach will provide optimum performance for each frequency band, it has a disadvantage in terms of increased cost and large size due to the use of two or more power amplifiers.

There have also been devices in which a single power amplifier has been used to amplify signals of two or more frequency bands. In such devices, two switches (in case of two frequency bands) are required to be used for the frequency band selection. This approach reduces the overall cost as it requires fewer active components (e.g., power amplifiers); however, the performance of the power amplifier is compromised for wideband operation. Also, the on-state loss of the switches degrades the overall efficiency of the device. In addition, it has been noted that in such devices a wideband matching network is required for impedance matching, however the power amplifier is not able to achieve different output power requirement for different frequency bands since the wideband matching network will constrain the impedance level that can be achieved over the given bandwidth.

To overcome this problem of the tradeoff between the power amplifier matching network and the bandwidth, in some implementations, each frequency band is provided with its own matching network. In such cases, the switches are inserted between the matching networks and the power amplifier output to facilitate selection of a required frequency band. However, since the switches are generally inserted at low impedance points, the on-state switch loss degrades the efficiency of the overall power amplifier performances.

Therefore, it is desirable to find techniques that reduce the cost and the size of the RF power amplifiers, and at the same time, achieving better overall performance.

SUMMARY

According to the embodiments illustrated herein, there is provided an output matching network comprising a first input and a plurality of first outputs. A plurality of impedance matching circuits is provided wherein each of the plurality of impedance matching circuits comprises an input and an output. The inputs of each of the plurality of impedance matching circuits are connected to the first input. The outputs of each of the plurality of impedance matching circuits are connected to the plurality of first outputs. One of the plurality of impedance matching circuits is active at a given time. The active impedance matching circuit of the plurality of impedance matching circuits exhibits a first input impendence at a first frequency band. Each inactive impedance matching circuit of the plurality of impedance matching circuits exhibits a second input impedance at the first frequency band. In an embodiment, the second input impendence is at least 10 times greater than the first input impendence.

According to the present invention, there is provided a multi-band power amplification system comprising a second input and a plurality of second outputs. The multi-band power amplification system includes a power amplifier with an input and an output, and the output matching network. The input of the power amplifier is coupled to the second input, the first input of the output matching network is coupled to the output of the power amplifier, and the plurality of first outputs of the output matching network is coupled to the plurality of second outputs.

According to embodiments herein, each of the plurality of impedance matching circuits of the output matching network comprises a first, second, and third inductors coupled in series. A first capacitor coupled in parallel to the second inductor. A second capacitor is coupled in shunt between a common terminal of the second and the third inductors, and a first ground terminal. A third capacitor is coupled in shunt between an output of the third inductor and a second ground terminal. A first switch is coupled in series to the first capacitor, and a second switch is coupled in series to the third capacitor. The first switch and the second switch are closed when the impedance matching circuit is inactive and the first switch and the second switch are open when the impedance matching circuit is active. One of the plurality of impedance matching circuits is active at a given time, and at least one of the inactive impedance matching circuits of the plurality of impedance matching circuits exhibits a first input harmonic impedance at twice a first frequency band, and wherein the first input harmonic impedance can be an open circuit or a short circuit.

BRIEF DESCRIPTION OF THE DRAWINGS

Various embodiments of the present disclosure will hereinafter be described in conjunction with the appended drawings provided to illustrate and not to limit the present disclosure, wherein like designations denote like elements, and in which.

DETAILED DESCRIPTION OF THE PREFERRED EMBODIMENTS

The invention can be best understood with reference to the detailed figures and description set forth herein. Various embodiments are discussed below with reference to the figures. However, those of ordinary skill in the art will readily appreciate that the detailed description given herein with respect to these figures is just for explanatory purposes. The disclosed systems extend beyond the described embodiments. For example, those of ordinary skill in the art will appreciate that in light of the teachings presented, multiple alternate and suitable approaches may be realized, to implement the functionality of any detail described herein, beyond the particular implementation choices in the following embodiments described and shown.

Figure 1A:
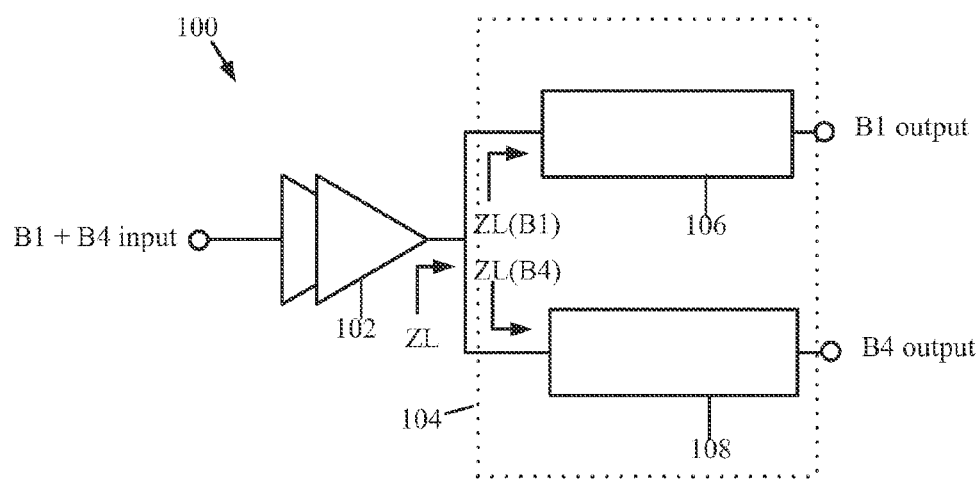
FIG. 1a is a block diagram illustrating a power amplification system in accordance with an embodiment.

FIG. 1a is a block diagram illustrating a power amplification system 100 in accordance with an embodiment. Power amplification system 100 comprises a second input and a plurality of second outputs. The power amplification system further comprises a power amplifier 102 and an output matching network 104.

In an embodiment, power amplifier 102 comprises an input and an output. Output matching network 104 has an input and a plurality of outputs. The input of power amplifier 102 is coupled to the second input of power amplification system 100. The input of output matching network 104 is coupled to the output of power amplifier 102. The plurality of outputs of output matching network 104 is coupled to the plurality of second outputs of power amplification system 100.

Output matching network 104 further comprises a plurality of impedance matching circuits (106, 108). Each of plurality of impedance matching circuits (106, 108) comprises an input and an output. The inputs of plurality of impedance matching circuits (106, 108) are connected to the input of output matching network 104. The outputs of plurality of impedance matching circuits (106, 108) are connected to plurality of outputs of output matching network 104.

In an embodiment, only one of plurality of impedance matching circuits (106, 108) is active at a given time. The active impedance matching circuit of plurality of impedance matching circuits (106, 108) exhibits a first input impendence at a first frequency band. Each inactive impedance matching circuit of plurality of impedance matching circuits (106, 108) exhibits a second input impedance at the first frequency band. In an embodiment, the second input impendence will be at least 10 times greater than the first input impendence.

In an embodiment, plurality of impedance matching circuits (106, 108) are designed/configured so that each inactive impedance matching circuit exhibits a first harmonic impedance, which is at twice the first frequency band. In an embodiment, the first input harmonic impedance may be an open circuit or a short circuit.

In an example, power amplification system 100 is configured to cover two frequency bands, B1 and B4, at the input of power amplifier 102. Output matching network 104 is provided with two impedance matching circuits (106, 108). A first impedance matching circuit 106 is configured to cover the signals of the frequency band B1 and a second impedance matching circuit 108 is configured to cover the signals of the frequency band B4. In an embodiment, first impedance matching circuit 106 exhibits impedance ZL(B1) at the frequency band B1 while second impedance matching circuit 108 exhibits impedance ZL(B4) at the frequency band B4. In an embodiment, the impedance of first impedance matching circuit 106 will be ZL(B1)opt at the frequency band B1 when first impedance matching circuit 106 is active. In an embodiment, the impedance of second impedance matching circuit 108 will be ZL(B4)opt at the frequency band B4 when second impedance matching circuit 108 is active.

In an embodiment, at a given time, either first impendence matching circuit 106 or second impedance matching circuit 108 will be active. In an embodiment, at the frequency band B1, first impedance matching circuit 106 is active and exhibits the impedance ZL(B1). At the same time, second impedance matching circuit 108 exhibits the impedance ZL(B4) at the frequency band B1. In an embodiment, the value of the impedance ZL(B4) will be 10 times the value of the impedance ZL(B1). As a result, negligible power is transmitted or lost through inactive second impedance matching circuit 108. In another embodiment, if second impedance matching circuit 108 is active at the impedance ZL(B4) at the frequency band B4, at the same time first impedance matching circuit 106 will exhibit the impedance ZL(B1) at the frequency band B4. The value of the impedance ZL(B1) is 10 times the value of the impedance ZL(B4). As a result, negligible power is going to be transmitted or lost through inactive second impedance matching circuit 108.

In an embodiment, when first impedance matching circuit 106 is active at the frequency band B1, second impedance matching circuit 108 exhibits a first input harmonic impedance at twice the frequency of the frequency band B1. The first input harmonic impedance is provided to output of power amplifier 102 for modifying the waveforms of the output voltage and current signals. This results in efficiency enhancement and hence lower current consumption for power amplifier 102. In another embodiment, when second impedance matching circuit 108 is active at the frequency band B4, first impedance matching circuit 106 will exhibit a second input harmonic impedance at twice the frequency of the frequency band B4. The second input harmonic impedance is provided to the output of power amplifier 102 for performance and efficiency enhancement.

In an embodiment, the output of power amplifier 102 is terminated with an impedance ZL. In an embodiment, the impedance ZL(B1) at the frequency band B1 is 5 ohms for first impedance matching circuit 106 and the impedance ZL(B4) at the frequency band B4 is 3 ohms for second impedance matching circuit 108.

Figure 1B:
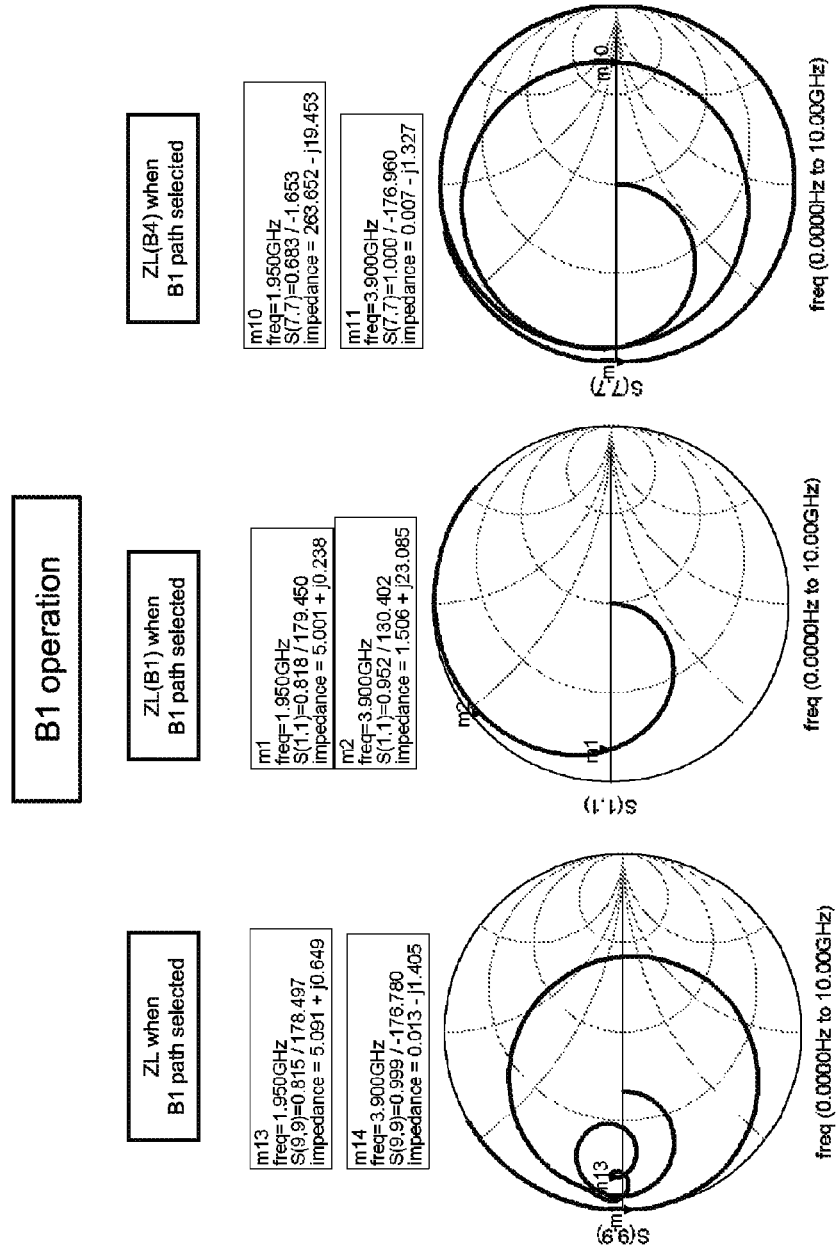
FIG. 1b depicts a Smith chart at frequency band B1 in the power amplification system of FIG. 1a in accordance with an embodiment.
Figure 1C:
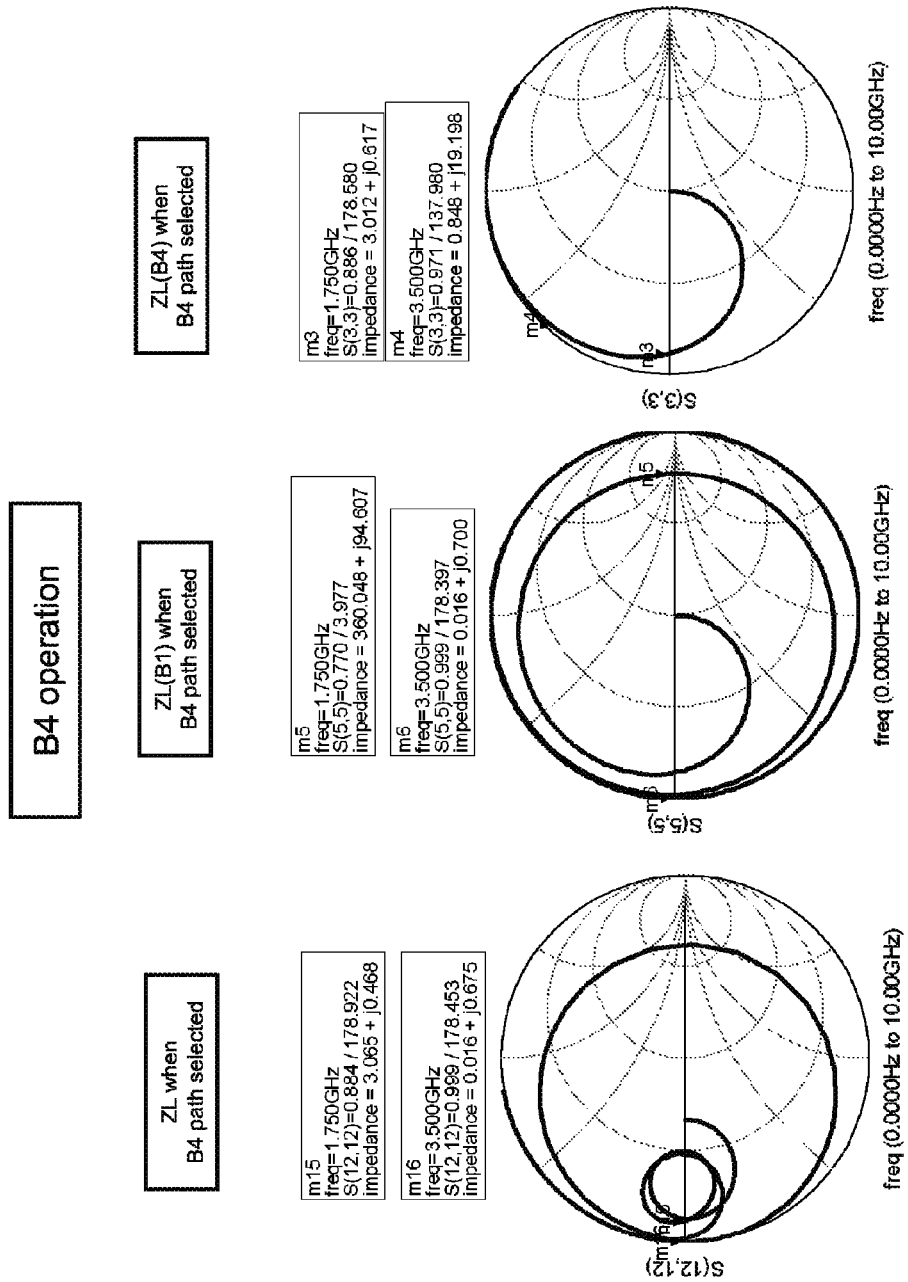
FIG. 1c depicts a Smith chart at frequency band B4 in the power amplification system of FIG. 1a in accordance with an embodiment.

FIG. 1b depicts a Smith chart at frequency band B1 in the power amplification system 100 of FIG. 1a in accordance with an embodiment. FIG. 1c is a Smith chart at frequency band B4 in the power amplification system 100 of FIG. 1a in accordance with an embodiment. In an embodiment, the Smith chart is being shown as a tool for visualizing the impedance of an impedance matching circuit as a function of frequency. The Smith charts shown in FIG. 1b and FIG. 1c are further used to provide the understanding of impedance matching circuits and their behavior from an impedance viewpoint. The Smith chart is further being used to display an actual (physical) circuit's impedance when measured on a Vector Network Analyzer (VNA).

In an embodiment, the following are the impedance conditions under the frequency band B1: Impedance ZL will be 5 ohms at the fundamental frequency of 1.95 GHz, and impedance ZL will be zero at the second harmonic frequency of 3.9 GHz. The impedance ZL(B1) will be 5 ohms for first impedance matching circuit 106 and the impedance ZL(B4) will be 264-20j Ohms for second impedance matching circuit 108 at the fundamental frequency of 1.95 GHz. The impedance ZL(B4) will be zero for second impedance matching circuit 108 at the second harmonic frequency of 3.9 GHz.

Thus, it is noted that under the frequency band B1 operation, the impedance of second impedance matching circuit 108 for the frequency band B4 does not impact the impedance intended for the output of power amplifier 102, that is, impedance ZL is equal to impedance ZL(B1)=5 ohms, since the impedance ZL(B4) is significantly larger than the impedance ZL(B1) under the frequency band B1. In addition, the impedance of the frequency band B4 provides a short to the output of power amplifier 102 at two times the frequency band B1.

Similarly, in an embodiment, under the frequency band B4, the impedance conditions are as follows. Impedance ZL is 3 ohms at the fundamental frequency of 1.75 GHz, and impedance ZL is zero at the second harmonic frequency of 3.5 GHz. The impedance ZL(B4) is 3 ohms for first impedance matching circuit 106 and the impedance ZL(B1) is 360+95 jOhms for second impedance matching circuit 108 at the fundamental frequency of 1.75 GHz. The impedance ZL(B1) is zero for second impedance matching circuit 108 at the second harmonic frequency of 3.5 GHz.

Thus, it is noted that under the frequency band B4 operation, the impedance of first impedance matching circuit 106 for the frequency band B1 does not impact the impedance intended for the output of power amplifier 102, that is, impedance ZL is equal to impedance ZL(B4)=3 ohms, since the impedance ZL(B1) is significantly larger than the impedance ZL(B4) under the frequency band B4. In addition, the impedance of the frequency band B1 provides a short to the output of power amplifier 102 at two times the frequency band B4.

Figure 2:
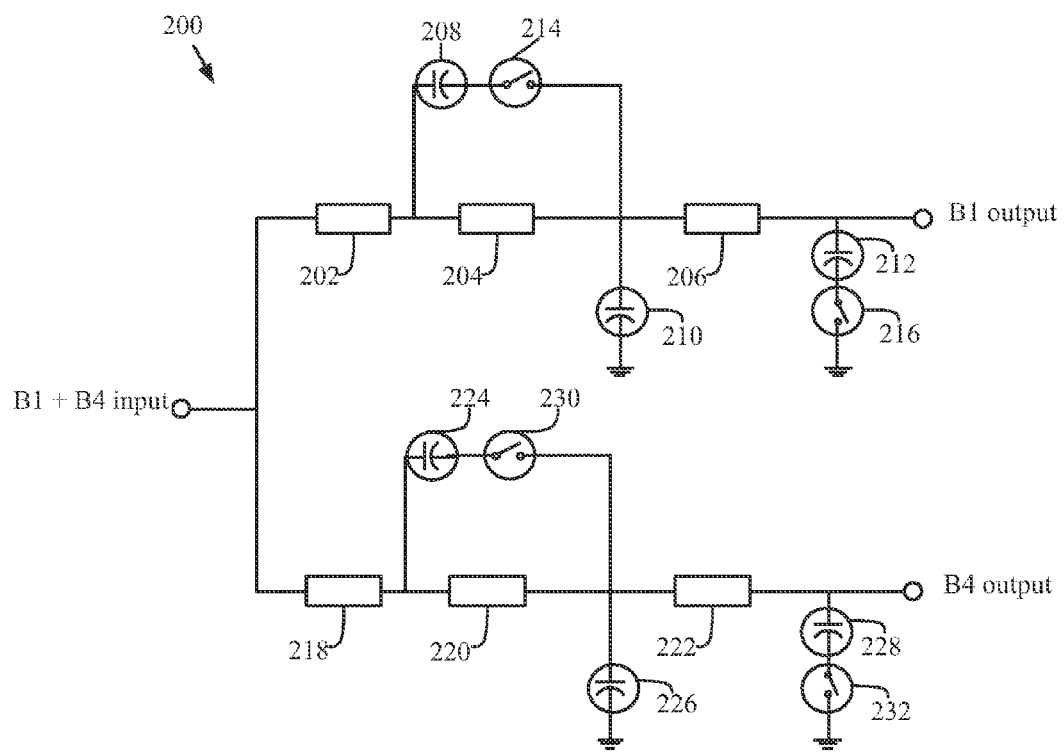
FIG. 2 is a schematic diagram illustrating the output matching network of FIG. 1a in accordance with an embodiment.

FIG. 2 is a schematic diagram illustrating the output matching network 200 of FIG. 1a in accordance with an embodiment. In an embodiment, the output matching network described in the power amplification system of FIG. 1a corresponds to output matching network 200.

Output matching network 200 comprises two impedance matching circuits. The two impedance matching circuits include a first and a second impedance matching circuit. Each of the two impedance matching circuit comprises one or more inductors, a plurality of capacitors, one or more transmission lines, or a plurality of switches. The one or more transmission lines and the plurality of capacitors comprise at least one of lumped elements, or distributed elements. The plurality of switches is selected from at least one of Field Effect Transistor (FET), Metal Oxide Semiconductor Field Effect Transistor (MOSFET), High Electron Mobility Transistor (HEMT), Bipolar Junction Transistor (BJT), p-n diodes, or PIN diodes. In an embodiment, the plurality of switches is fabricated from materials selected from at least one of a Si/Si, SIO/Si, SOS, or III-V semiconductor such as GaAs/InP.

In an embodiment, the first impedance matching circuit of output matching network 200 comprises a first inductor 202, a second inductor 204, and a third inductor 206. First inductor 202, second inductor 204, and third inductor 206 are connected in series. The first impedance matching circuit of output matching network 200 further comprises a first capacitor 208, a second capacitor 210, and a third capacitor 212. First capacitor 208 is coupled in parallel to second inductor 204. Second capacitor 210 is coupled in shunt between a common terminal of second inductor 204 and third inductor 206, and a ground terminal. Third capacitor 212 is coupled in shunt between an output of third inductor 206 and the ground terminal. The first impedance matching circuit of output matching network 200 further comprises a first switch 214 and a second switch 216. First switch 214 is coupled in series to first capacitor 208. Second switch 216 is coupled in series to third capacitor 212.

First switch 214 and second switch 216 are closed when the first impedance matching circuit of output matching network 200 is inactive. First switch 214 and second switch 216 are open when the first impedance matching circuit of output matching network 200 is active.

The second impedance matching circuit of output matching network 200 comprises a fourth inductor 218, a fifth inductor 220, and a sixth inductor 222. Fourth inductor 218, fifth inductor 220, and sixth inductor 222 are connected in series. The second impedance matching circuit of output matching network 200 further comprises a fourth capacitor 224, a fifth capacitor 226, and a sixth capacitor 228. Fourth capacitor 224 is coupled in parallel to fifth inductor 220. Fourth capacitor 226 is coupled in shunt between a common terminal of fourth inductor 220 and sixth inductor 222, and a ground terminal. Sixth capacitor 228 is coupled in shunt between an output of sixth inductor 222 and the ground terminal. The second impedance matching circuit of output matching network 200 further comprises a third switch 230 and a fourth switch 232. Third switch 230 is coupled in series to fourth capacitor 224. Fourth switch 232 is coupled in series to sixth capacitor 228.

Third switch 230 and fourth switch 232 are closed when the second impedance matching circuit of output matching network 200 is inactive. Third switch 230 and fourth switch 232 are open when the second impedance matching circuit of output matching network 200 is active.

In one embodiment, at the frequency band B1, first switch 214 and second switch 216 are open while third switch 230 and fourth switch 232 are closed. First inductor 202, second inductor 204, second capacitor 210 and third inductor 206 form a matching network that exhibits an input impedance ZL(B1) at the frequency band B1 according to FIG. 1(b). Fourth inductor 218, fifth inductor 220, fourth capacitor 224, third switch 230 and fifth capacitor 226 form a matching network that exhibits a short circuit input impedance ZL(B4) at two times the frequency band B1 according to FIG. 1(b). Fourth inductor 218, fifth inductor 220, fifth capacitor 226, sixth inductor 222, sixth capacitor 228 and fourth switch 232 form a matching network that exhibits an input impedance ZL(B4) that is at least 10 times the value of the impedance ZL(B1) at the frequency band B1 according to FIG. 1(b). In this embodiment, the input impedances of output matching network 200 are equal to ZL(B1), and short circuit at the frequency band of B1 and two times the frequency band of B1, respectively.

In one embodiment, at the frequency band B4, first switch 214 and second switch 216 are closed while third switch 230 and fourth switch 232 are open. Fourth inductor 218, fifth inductor 220, fifth capacitor 226 and sixth inductor 222 form a matching network that exhibits an input impedance ZL(B4) at the frequency band B4 according to FIG. 1(c). First inductor 202, second inductor 204, first capacitor 208, first switch 214 and second capacitor 210 form a matching network that exhibits a short circuit input impedance ZL(B1) at two times the frequency band B4 according to FIG. 1(c). First inductor 202, second inductor 204, second capacitor 210, third inductor 206, third capacitor 212 and second switch 216 form a matching network that exhibits an input impedance ZL(B1) that is at least 10 times the value of the impedance ZL(B4) at the frequency band B4 according to FIG. 1(c). In this embodiment, the input impedances of output matching network 200 are equal to ZL(B4), and short circuit at the frequency band of B4 and two times the frequency band of B4, respectively.

Figure 3:
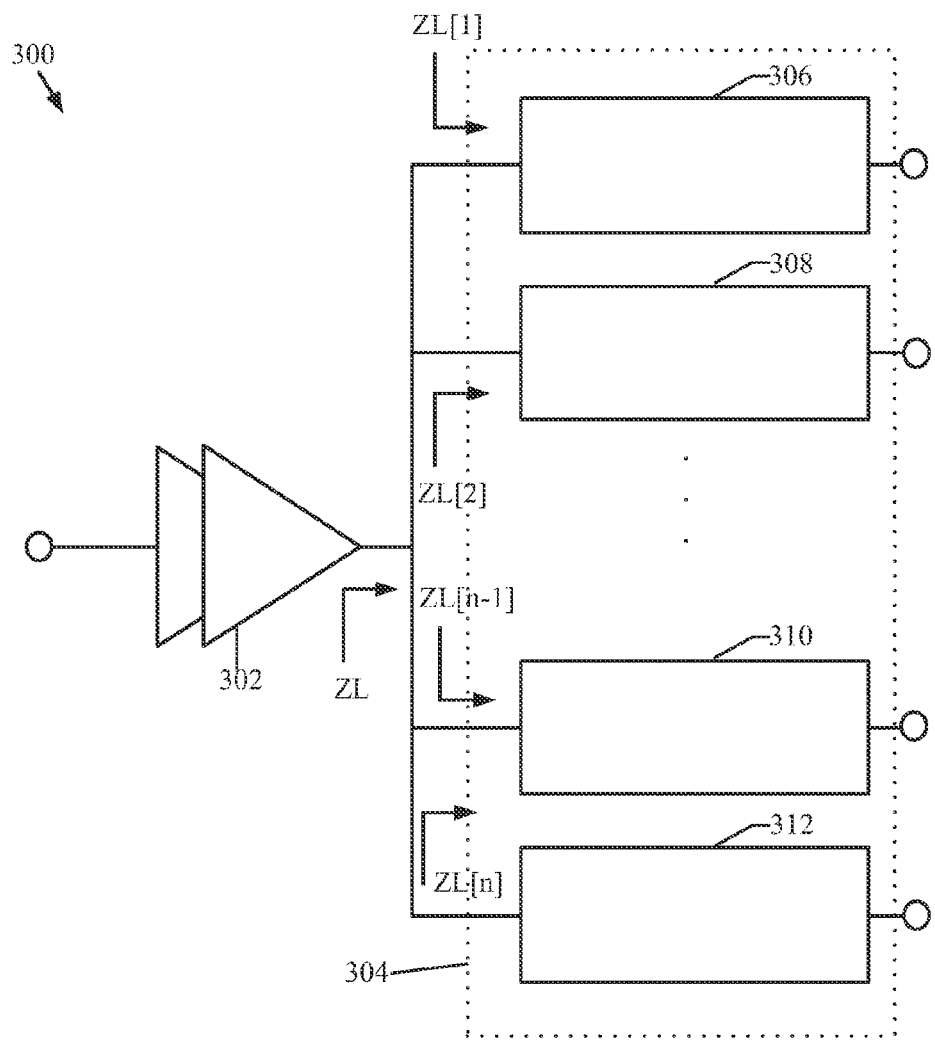
FIG. 3 is a block diagram illustrating a power amplification system in accordance with an embodiment.

FIG. 3 is a block diagram illustrating a power amplification system 300 in accordance with an embodiment of the invention. Power amplification system 300 comprises a power amplifier 302 and an output matching network 304. In this embodiment, power amplification system 300 is configured to amplify the signals at a designated frequency band. Output matching network 304 of power amplification system 300 is provided with n number impedance matching circuits (306, 308, ... 310, 312).

Only one of n numbers of impedance matching circuits (306, 308, ... 310, 312) is active at a given time. The active impedance matching circuit of n number of impedance matching circuits (306, 308, ... 310, 312) exhibit a first impendence at a designated frequency band. Each of the n−1 inactive impedance matching circuits of n number of impedance matching circuits (306, 308, ... 310, 312) exhibits an impedance which is at least 10 times greater than the first impendence at the designated frequency band. The n−1 inactive impedance matching circuit of n number of impedance matching circuits (306, 308, ... 310, 312) exhibits an harmonic impedance which is at twice the first frequency band. In an embodiment, the harmonic impedance may be an open circuit or a short circuit.

In one embodiment, impedance matching circuit 306 is active while other impedance matching circuits (308, ... 310, 312) are inactive. Active impedance matching circuit 306 exhibits an input impedance ZL[1] at frequency band of f[1]. Inactive impedance matching circuits (308, ... 310, 312) exhibit input impedances at least 10 times the value of ZL[1] at the frequency band of f[1]. One of inactive impedance matching circuits (308, ... 310, 312) exhibits a third input harmonic impedance at twice the frequency band of f[1], wherein the third input harmonic impedance may be an open circuit or a short circuit. In this embodiment, the impedances ZL of output matching network 304 are equal to ZL[1] and the third harmonic impedance at the frequency band of f[1] and two times the frequency band of f[1], respectively.

Figure 4:
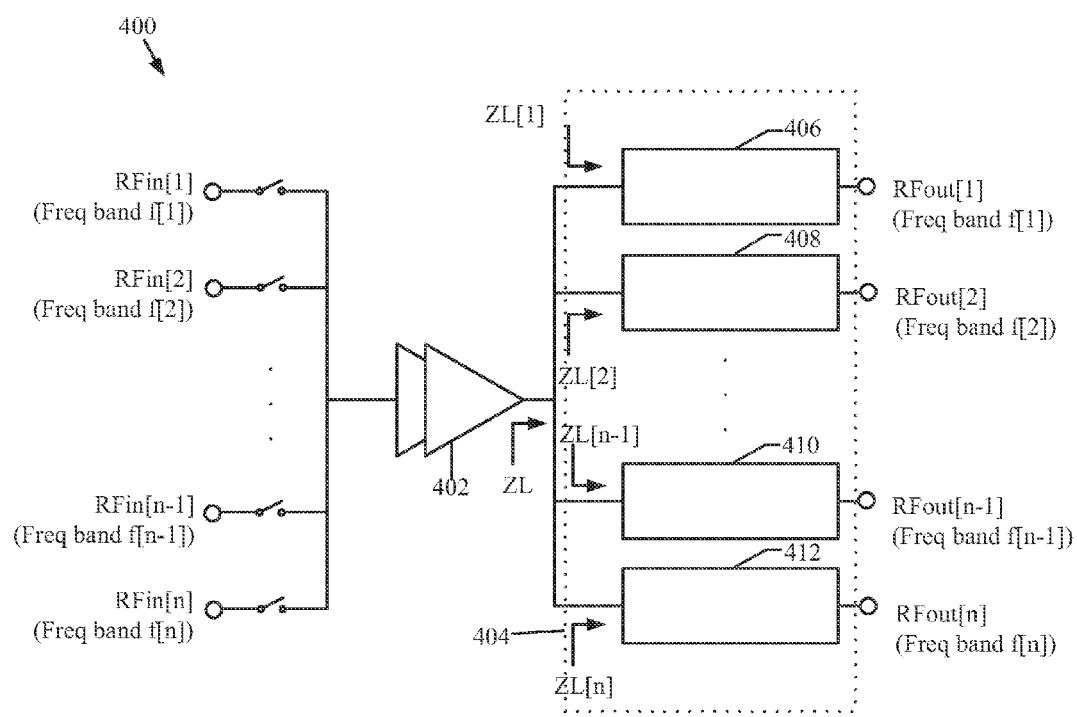
FIG. 4 is a block diagram illustrating a power amplification system in accordance with an embodiment.

FIG. 4 is a block diagram illustrating a power amplification system 400 in accordance with another embodiment of the invention. Power amplification system 400 comprises a power amplifier 402 and an output matching network 404. In an embodiment, power amplification system 400 is configured to amplify the signals of n number of frequency bands. Output matching network 404 of the power amplification system is provided with n number impedance matching circuits (406, 408, ..., 410, 412).

In this embodiment, n number of frequency band inputs can be provided to power amplifier 402. The n number of frequency bands inputs of power amplifier 402 is proportional to the n number of outputs of power amplifier 402. Power amplifier 402 is designed/configured to amplify the n number of frequency bands inputs and provides the amplified output signals at n output terminals.

Figure 5:
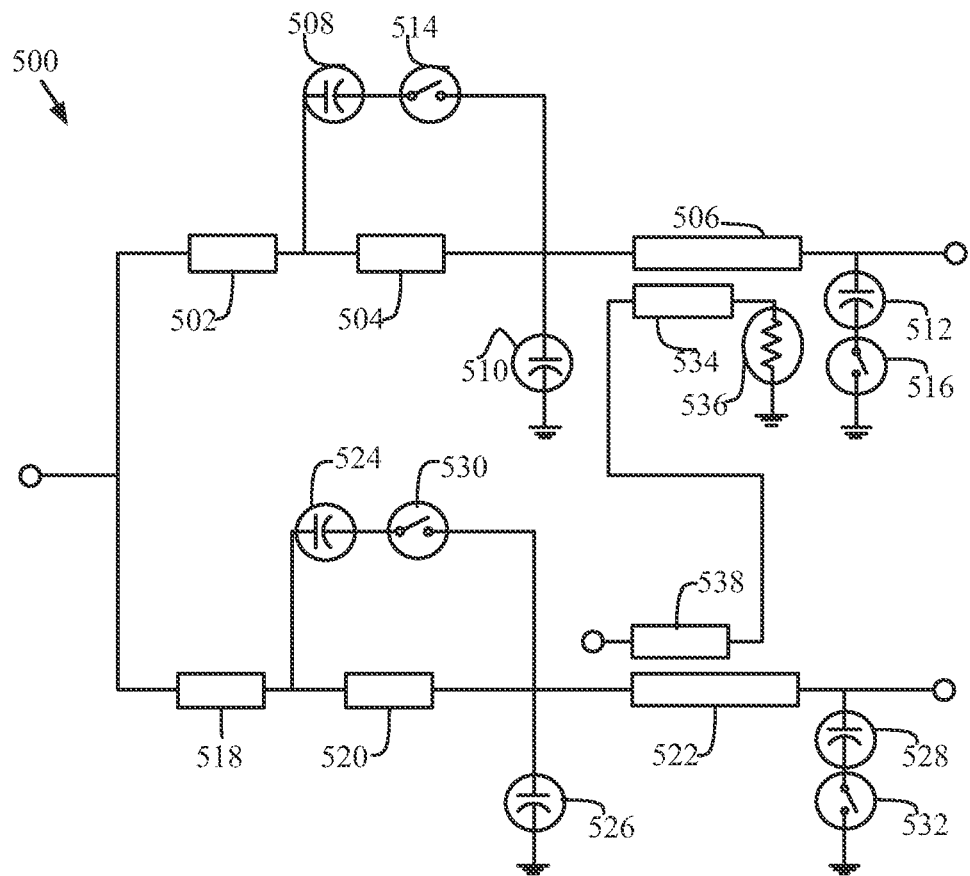
FIG. 5 is a schematic diagram illustrating an output matching network in accordance with an embodiment.

FIG. 5 is a schematic diagram illustrating an output matching network 500 in accordance with another embodiment.

Output matching network 500 comprises two impedance matching circuits. The two impedance matching circuits include a first and a second impedance matching circuit. Each of the two impedance matching circuits comprises one or more inductors, a plurality of capacitors, one or more transmission lines, or a plurality of switches. The output matching network 500 further comprises a plurality of directional couplers. In an embodiment, the plurality of directional couplers is coupled to the one or more transmission lines. The one or more transmission lines and the plurality of capacitors comprise at least one of lumped elements, or distributed elements. The plurality of switches is selected from at least one of Field Effect Transistor (FET), Metal Oxide Semiconductor Field Effect Transistor (MOSFET), High Electron Mobility Transistor (HEMT), Bipolar Junction Transistor (BJT), p-n diodes, or PIN diodes. In an embodiment, the plurality of switches is fabricated from materials selected from at least one of a Si/Si, SIO/Si, SOS, or III-V semiconductor such as GaAs/InP.

The first impedance matching circuit of output matching network 500 comprises a first inductor 502, a second inductor 504, and a third inductor 506. First inductor 502, second inductor 504, and third inductor 506 are connected in series. The first impedance matching circuit further comprises a first capacitor 508, a second capacitor 510, and a third capacitor 512. First capacitor 508 is coupled in parallel to second inductor 504. Second capacitor 510 is coupled in shunt between a common terminal of second inductor 504 and third inductor 506, and a ground terminal. Third capacitor 512 is coupled in shunt between an output of third inductor 506 and the ground terminal. The first impedance matching circuit further comprises a first switch 514 and a second switch 516. First switch 514 is coupled in series to first capacitor 508. Second switch 516 is coupled in series to third capacitor 512.

First switch 514 and second switch 516 are closed when the first impedance matching circuit is inactive. In an embodiment, first switch 514 and second switch 516 are open when the first impedance matching circuit is active.

The second impedance matching circuit of output matching network 500 comprises a fourth inductor 518, a fifth inductor 520, and a sixth inductor 522. Fourth inductor 518, fifth inductor 520, and sixth inductor 522 are connected in series. The second impedance matching circuit further comprises a fourth capacitor 524, a fifth capacitor 526, and a sixth capacitor 528. Fourth capacitor 524 is coupled in parallel to fifth inductor 520. Fourth capacitor 526 is coupled in shunt between a common terminal of fourth inductor 520 and sixth inductor 522, and a ground terminal. Sixth capacitor 528 is coupled in shunt between an output of sixth inductor 522 and the ground terminal. The second impedance matching circuit further comprises a third switch 530 and a fourth switch 532. Third switch 530 is coupled in series to fourth capacitor 524. Fourth switch 532 is coupled in series to sixth capacitor 528.

Third switch 530 and fourth switch 532 are closed when the second impedance matching circuit is inactive. In an embodiment, third switch 530 and fourth switch 532 are open when the second impedance matching circuit is active.

The first impedance matching circuit of output matching network 500 exhibits impedance ZL(B1) at the frequency band B1 while the second impedance matching circuit of output matching network 500 exhibits impedance ZL(B4) at the frequency band B4. In one embodiment, at a frequency band B1, first switch 514 and second switch 516 are open while third switch 530 and fourth switch 532 are closed. First inductor 502, second inductor 504, second capacitor 510 and third inductor 506 form a matching network that exhibits an input impedance ZL(B1) at the frequency band B1. Fourth inductor 518, fifth inductor 520, fourth capacitor 524, third switch 530 and fifth capacitor 526 form a matching network that exhibits a short circuit input impedance ZL(B4) at two times the frequency band B1. Fourth inductor 518, fifth inductor 520, fifth capacitor 526, sixth inductor 522, sixth capacitor 528 and fourth switch 532 form a matching network that exhibits an input impedance ZL(B4) that is at least 10 times the value of the impedance ZL(B1) at the frequency band B1. In this embodiment, the input impedances of output matching network 500 are equal to ZL(B1), and short circuit at the frequency band of B1 and two times the frequency band of B1, respectively.

In one embodiment, at a frequency band B4, first switch 514 and second switch 516 are closed while third switch 530 and fourth switch 532 are open. Fourth inductor 518, fifth inductor 520, fifth capacitor 526 and sixth inductor 522 form a matching network that exhibits an input impedance ZL(B4) at the frequency band B4. First inductor 502, second inductor 504, first capacitor 508, first switch 514 and second capacitor 510 form a matching network that exhibits a short circuit input impedance ZL(B1) at two times the frequency band B4. First inductor 502, second inductor 504, second capacitor 510, third inductor 506, third capacitor 512 and second switch 516 form a matching network that exhibits an input impedance ZL(B1) that is at least 10 times the value of the impedance ZL(B4) at the frequency band B4. In this embodiment, the input impedances of output matching network 500 are equal to ZL(B4), and short circuit at the frequency band of B4 and two times the frequency band of B4, respectively.

In an embodiment, third inductor 506 and a transmission line 534 form a first directional coupler and is coupled to first impedance matching circuit of output matching network 500. Similarly, sixth inductor 522 and a transmission line 538 form a second directional coupler coupled to second impedance matching circuit of output matching network 500. In an embodiment, third inductor 506 and sixth inductor 522 act as the through arm of first and second directional couplers respectively, whereas transmissions lines (534 and 538) act as the coupled arm of the first and second directional couplers respectively. It will be apparent to a person skilled in the art that required length of the transmission lines (534 and 538) for first and second directional couplers is dependent upon the coupling factor requirement.

In an embodiment, first and second directional couplers (are daisy chained together. Also, by embedding the first and second directional couplers (into output matching network 500 through the re-use of some existing matching elements, it will save area and cost to integrate first and second directional couplers (534, 538) as part of first impedance matching circuit and second impedance matching circuit of output matching network 500. In an embodiment, resistor 536 acts as a termination for the couplers.

The various embodiments of the present invention provide several advantages. The power amplification system 100 is designed in a manner that the power amplifier 102 and the output matching network 104 are an integral part of the power amplification system 100, thus the overall area and size gets reduced, resulting in cost savings. Further, in the output matching network 104 having a plurality of impedance matching circuits (106, 108), since only one of plurality of impedance matching circuits (106, 108) is active at a time, the impedance matching circuit is specifically optimized for a particular frequency band without comprising performances over wide frequency operation. In addition, the non-active impedance matching circuits have negligible power loss at the operating frequency while providing optimum harmonic impedance termination to power amplifier 102 at twice the operating frequency.

While various embodiments of the present invention have been illustrated and described, it will be clear that the electronic components (e.g., each of the two impedance matching circuits comprising one or more inductors, the plurality of capacitors, one or more transmission lines, or the plurality of switches) of the multi-band power amplification system can be fabricated as a single integrated circuit, or as discrete circuit components connected together. Further, various other possible combinations of the electronic components may also be used without departing from the scope of the invention.

While various embodiments of the present invention have been illustrated and described, it will be clear that the present invention is not limited to these embodiments. Numerous modifications, changes, variations, substitutions, and equivalents will be apparent to those skilled in the art without departing from the spirit and scope of the invention, as described in the claims that follow.

What is claimed is:

1. An output matching network comprising:
    a first input and a plurality of first outputs;
    a plurality of impedance matching circuits, each of the plurality of impedance matching circuits comprising an input and an output, wherein:
    the inputs of each of the plurality of impedance matching circuits are connected to the first input,
    the outputs of each of the plurality of impedance matching circuits are connected to the plurality of first outputs,
    one of the plurality of impedance matching circuits is active at a given time,
    the active impedance matching circuit of the plurality of impedance matching circuits exhibits a first input impendence at a first frequency band,
    each inactive impedance matching circuit of the plurality of impedance matching circuits exhibits a second input impedance at the first frequency band, and wherein the second input impendence is at least 10 times greater than the first input impendence.

2. The output matching network of claim 1, wherein at least one of the inactive impedance matching circuit of the plurality of impedance matching circuits exhibits a first input harmonic impedance at twice the first frequency band.

3. The output matching network of claim 2, wherein the first input harmonic impedance can be an open circuit or a short circuit.

4. The output matching network of claim 1, wherein each impendence matching circuit of the plurality of impedance matching circuits comprises one or more of a plurality of inductors, a plurality of capacitors, one or more transmission lines, or a plurality of switches.

5. The output matching network of claim 4, wherein the one or more transmission lines and the plurality of capacitors comprise at least one of: lumped elements and distributed elements.

6. The output matching network of claim 1, wherein each of the plurality of impedance matching circuits comprises:
    a first, a second, and a third inductor coupled in series;
    a first capacitor coupled in parallel to the second inductor;
    a second capacitor coupled in shunt between a common terminal of the second and the third inductors, and a ground terminal; and
    a third capacitor coupled in shunt between an output of the third inductor and the ground terminal.

7. The output matching network of claim 6, wherein each of the plurality of impedance matching circuits comprises:
    a first switch coupled in series to the first capacitor; and
    a second switch coupled in series to the third capacitor, wherein the first switch and the second switch are closed when the impedance matching circuit is inactive, and the first switch and the second switch are open when the impedance matching circuit is active.

8. The output matching network of claim 1, wherein each of the plurality of impedance matching circuits comprises:
    a plurality of transmission lines coupled in series;
    a directional coupler coupled to at least one of the plurality of transmission lines;
    a plurality of capacitors coupled to the plurality of transmission lines; and a plurality of switches, wherein the plurality of switches are closed when the impedance matching circuit is inactive and the plurality of switches are open when the impedance matching circuit is active.

9. A multi-band power amplification system comprising:
a second input and a plurality of second outputs;
a power amplifier having an input and an output; and
an output matching network having an input and a plurality of outputs, wherein the input of the power amplifier is coupled to the second input, the input of the output matching network is coupled to the output of the power amplifier, the plurality of outputs of the output matching network is coupled to the plurality of second outputs, and wherein the output matching network comprises:
a plurality of impedance matching circuits, each of the plurality of impedance matching circuits comprising an input and an output, wherein:
the inputs of the plurality of impedance matching circuits are connected to the input of the output matching network;
the outputs of the plurality of impedance matching circuits are connected to the plurality of outputs of the output matching network;
one of the plurality of impedance matching circuits is active at a given time,
the active impedance matching circuit of the plurality of impedance matching circuits exhibits a first input impendence at a first frequency band,
each inactive impedance matching circuit of the plurality of impedance matching circuits exhibits a second input impedance at the first frequency band, and wherein the second input impendence is at least 10 times greater than the first input impendence.

10. The multi-band power amplification system of claim 9, wherein at least one of the inactive impedance matching circuit of the plurality of impedance matching circuits exhibits a first input harmonic impedance at twice the first frequency band.

11. The multi-band power amplification system of claim 10, wherein the first input harmonic impedance is at least one of: an open circuit and a short circuit.

12. The multi-band power amplification system of claim 9, wherein each impendence matching circuit of the plurality of impedance matching circuits comprises one or more of a plurality of inductors, a plurality of capacitors, one or more transmission lines, or a plurality of switches.

13. The multi-band power amplification system of claim 9, wherein each of the plurality of impedance matching circuits comprises:
a first, second, and third inductors coupled in series;
a first capacitor coupled in parallel to the second inductor;
a second capacitor coupled in shunt between a common terminal of the second and the third inductors, and a ground terminal; and
a third capacitor coupled in shunt between an output of the third inductor and the ground terminal.

14. The multi-band power amplification system of claim 13, wherein each of the plurality of impedance matching circuits comprises:
a first switch coupled in series to the first capacitor; and
a second switch coupled in series to the third capacitor;
wherein the first switch and the second switch are closed when the impedance matching circuit is inactive, and the first switch and the second switch are open when the impedance matching circuit is active.

15. The multi-band power amplification system of claim 9, wherein at least one of the plurality of impedance matching circuits comprises:
a plurality of transmission lines coupled in series to each other;
a directional coupler coupled to at least one of the plurality of transmission lines;
a plurality of capacitors coupled to the plurality of transmission lines; and
a plurality of switches, wherein the plurality of switches are closed when the impedance matching circuit is inactive and the plurality of switches are open when the impedance matching circuit is active.

16. A multi-band power amplification system comprising:
a second input and a plurality of second outputs;
a power amplifier having an input and an output; and
an output matching network having an input and a plurality of outputs, wherein the input of the power amplifier is coupled to the second input, the input of the output matching network coupled to the output of the power amplifier,
the plurality of outputs of the output matching network being coupled to the plurality of second outputs, and wherein the output matching network comprises:
a plurality of impedance matching circuits, each of the plurality of impedance matching circuits comprising an input and an output, wherein:
the inputs of each of the plurality of impedance matching circuits are connected to the input of the output matching network,
the outputs of each of the plurality of impedance matching circuits are connected to the outputs of the output matching network,
the output matching network further comprising a plurality of impedance matching circuits, wherein each of the plurality of impendence matching circuits comprising:
an input and an output; a first, second, and third inductors coupled in series; a first capacitor coupled in parallel to the second inductor; a second capacitor coupled in shunt between a common terminal of the second and the third inductors, and a first ground terminal; a third capacitor coupled in shunt between an output of the third inductor and a second ground terminal; a first switch coupled in series to the first capacitor; and a second switch coupled in series to the third capacitor, wherein the first switch and the second switch are closed when the impedance matching circuit is inactive and the first switch and the second switch are open when the impedance matching circuit is active;
wherein one of the plurality of impedance matching circuits is active at a given time, the active output impedance matching circuit of the plurality of impedance matching circuits exhibits a first impendence at a first frequency band, each inactive impedance matching circuit of the plurality of impedance matching circuits exhibits a second impedance at the first frequency band, and wherein the second impendence is at least 10 times greater than the first impendence, at least one of the inactive impedance matching circuit of the plurality of impedance matching circuits exhibits a first input harmonic impedance at twice the first frequency band, and wherein the first input harmonic impedance can be an open circuit or a short circuit.

17. The multi-band power amplification system of claim 13 further comprising:

an input matching network having a plurality of third inputs and a third output, wherein the third output is coupled to the input of the power amplifier; and a plurality of impedance matching circuits, each of the plurality of impedance matching circuits comprising an input and an output, wherein:

the inputs of each of the plurality of impedance matching circuits are connected to the third inputs, the outputs of each of the plurality of impedance matching circuits are connected to the third output, one of the plurality of impedance matching circuits is active at a given time, each of the plurality of impedance matching circuits having a series switch, wherein the series switch is closed when the impedance matching circuit is active and the series switch is open when the impedance matching circuit is inactive.

\* \* \* \* \*